United States Patent
Gomez et al.

(10) Patent No.: US 8,022,755 B2
(45) Date of Patent: Sep. 20, 2011

(54) AMPLIFIER WITH AUTOMATIC GAIN PROFILE CONTROL AND CALIBRATION

(75) Inventors: Ramon Gomez, San Juan Cap, CA (US);
Jianhong Xiao, Irvine, CA (US);
Takayuki Hayashi, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/856,290

(22) Filed: Aug. 13, 2010

(65) Prior Publication Data

US 2010/0308918 A1 Dec. 9, 2010

Related U.S. Application Data

(63) Continuation of application No. 12/172,725, filed on Jul. 14, 2008, now Pat. No. 7,804,356.

(60) Provisional application No. 61/046,563, filed on Apr. 21, 2008.

(51) Int. Cl.
*H03F 3/04* (2006.01)

(52) U.S. Cl. .......................................... 330/2; 330/289
(58) Field of Classification Search ..................... 330/2
See application file for complete search history.

(56) References Cited

U.S. PATENT DOCUMENTS

| | | | |
|---|---|---|---|
| 5,625,316 A * | 4/1997 | Chambers et al. | 327/553 |
| 7,795,981 B2 * | 9/2010 | Reis | 330/311 |
| 2008/0122542 A1 | 5/2008 | Bowles et al. | |
| 2009/0261899 A1 | 10/2009 | Gomez et al. | |

* cited by examiner

*Primary Examiner* — Steven J Mottola
(74) *Attorney, Agent, or Firm* — Sterne, Kessler, Goldstein & Fox P.L.L.C.

(57) ABSTRACT

Embodiments of the present invention provide systems and methods for automatic amplifier gain profile control, including a method for automatically configuring a variable gain profile amplifier according to received input and a variable gain profile amplification system. Further, embodiments of the present invention provide systems and methods for increased gain profile accuracy, including methods and systems to reduce the effects of temperature and/or process variations on the gain profile of an amplifier.

31 Claims, 13 Drawing Sheets

AMPLIFIER WITH AUTOMATIC GAIN PROFILE CONTROL AND CALIBRATION

CROSS-REFERENCE TO RELATED APPLICATIONS

The present application is a continuation of U.S. patent application Ser. No. 12/172,725, filed Jul. 14, 2008, which claims the benefit of U.S. Provisional Patent Application No. 61/046,563, filed Apr. 21, 2008, both of which are incorporated herein by reference in their entirety.

BACKGROUND OF THE INVENTION

1. Field of the Invention

The present invention relates generally to amplifier gain profile control and calibration.

2. Background Art

Radio Frequency (RF) amplifiers, including broadband RF amplifiers, are typically designed to have flat gain, noise figure (NF), and linearity over their operating frequency range, as much as practically possible.

However, in many applications (e.g., cable television (CATV)), the input signal may not have equal power and density across the entire operating frequency range. As a result, when the input signal is amplified by a flat gain amplifier, weaker power components of the resulting amplified signal will have poorer signal-to-noise ratio (SNR) and signal-to-distortion ratio (SDR) than prior to amplification. Further, this degradation in SNR and SDR will continue in subsequent signal processing stages of the overall system.

There is a need therefore to amplify the input signal such that the resulting amplified signal has substantially uniform SNR and SDR across the entire operating frequency range. Further, since the input signal may vary over time, there is a need to adaptively shape the gain profile of the amplifier according to the input signal. At the same time, for best amplification performance, there is a need to accurately set and control the gain profile of an amplifier and to minimize gain profile variations due to temperature and/or process variations, for example.

Conventional solutions use multiple amplifiers with different gain profiles and switch from one amplifier to another according to the input signal to achieve the desired amplification. Clearly, however, these solutions are expensive and need to be designed with a priori knowledge or estimate of the input signal. Further, these solutions cannot guarantee the gain profile accuracy required by some applications or compensate for gain profile variations.

BRIEF SUMMARY OF THE INVENTION

The present invention relates generally to amplifier gain profile control and calibration.

In one aspect, embodiments of the present invention provide systems and methods for automatic amplifier gain profile control. Embodiments of the present invention enable, among other functionalities, variable gain amplification, automatic tilt compensation, and gain boost optimization. For example, embodiments of the present invention enable methods for automatically configuring a variable gain amplifier according to received input, thereby optimizing the dynamic range of the resulting amplified signal. Embodiments of the present invention further enable a variable gain profile amplification system.

In another aspect, embodiments of the present invention provide systems and methods for increased gain profile accuracy. For example, embodiments of the present invention provide systems and methods to reduce the effects of temperature and/or process variations on the gain profile of an amplifier through automatic calibration of components of the amplifier.

Embodiments of the present invention can be used to enable analog and/or digital amplifiers, including power amplifiers for audio, video, audio/video (A/V) (e.g. Cable Television (CATV) and Direct Broadcast Satellite (DBS) signals), and/or broadband RF signals. However, embodiments of the present invention are not limited to usage within amplifier systems and may be used within other systems, as would be understood by a person skilled in the art based on the teachings herein.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
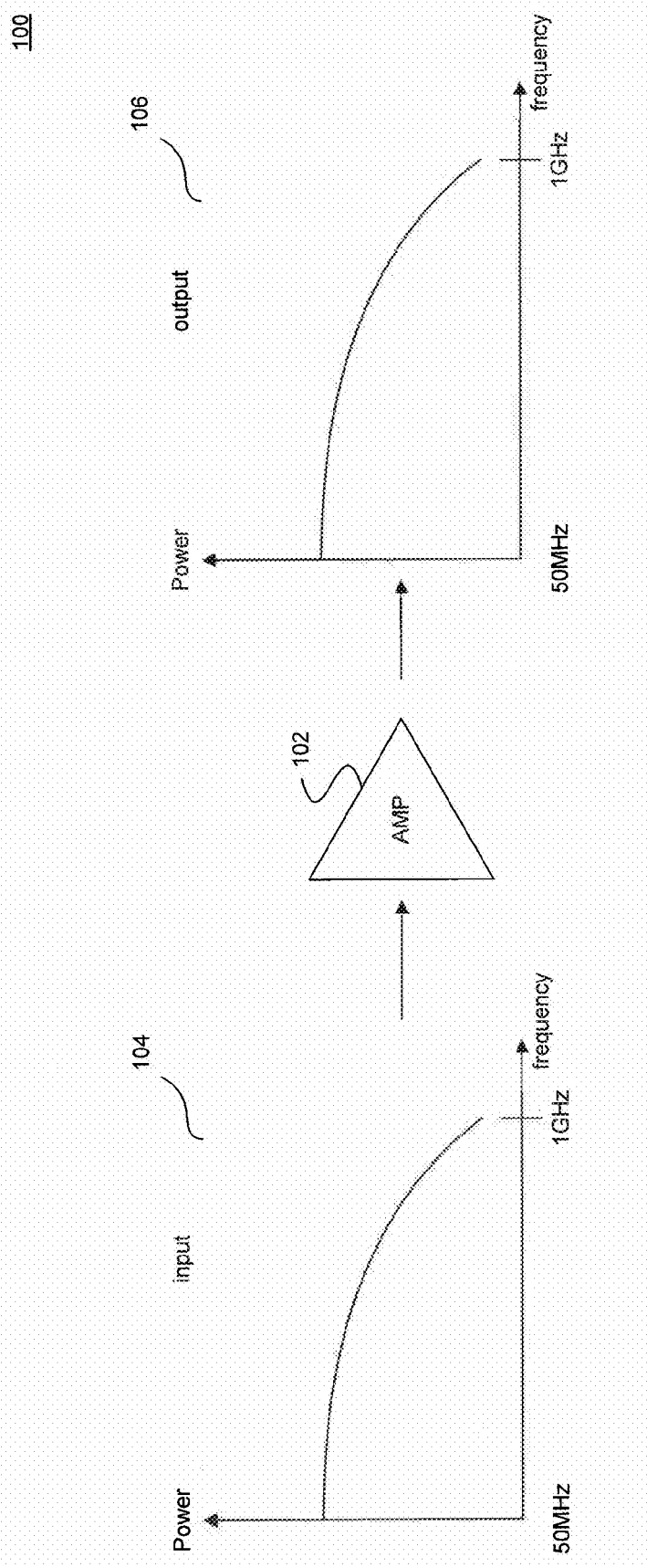
FIG. 1 is an example that illustrates the amplification of an input signal having a frequency-dependent power spectrum by a flat gain amplifier.

The present invention well be described with reference to the accompanying drawings. Generally, the drawing in which

DETAILED DESCRIPTION OF EMBODIMENT(S)

Overview

The present invention relates generally to amplifier gain profile control and calibration.

In one aspect, embodiments of the present invention provide systems and methods for automatic amplifier gain profile control. Embodiments of the present invention enable, among other functionalities, variable gain amplification, automatic tilt compensation, and gain boost optimization. For example, embodiments of the present invention enable methods for automatically configuring a variable gain amplifier according to received input, thereby optimizing the dynamic range of the resulting amplified signal. Embodiments of the present invention further enable a variable gain profile amplification system.

In another aspect, embodiments of the present invention provide systems and methods for increased gain profile accuracy. For example, embodiments of the present invention provide systems and methods to reduce the effects of temperature and/or process variations on the gain profile of an amplifier through automatic calibration of components of the amplifier.

Embodiments of the present invention can be used to enable analog and/or digital amplifiers, including power amplifiers for audio, video, audio/video (A/V) (e.g. Cable Television (CATV) and Direct Broadcast Satellite (DBS) signals), and/or broadband RF signals. However, embodiments of the present invention are not limited to usage within amplifier systems and may be used within other systems, as would be understood by a person skilled in the art based on the teachings herein.

INTRODUCTION

Radio Frequency (RF) amplifiers, including broadband RF amplifiers, are typically designed to have flat gain, noise figure (NF) (ratio of output noise to thermal noise), and linearity over their operating frequency range, as much as practically possible. However, in many applications (e.g., cable television (CATV)), the input signal may not have equal power and density across the entire operating frequency range. This may be because the input signal is received over a frequency-dependent transmission medium (e.g., coaxial cable) or is transmitted with uneven power or density. For example, a CATV signal spectrum typically includes strong power analog signals at low frequencies and weaker power digital signals at high frequencies.

FIG. 1 is an example 100 that illustrates the amplification of an input signal 104 having a frequency-dependent power spectrum by a flat gain amplifier 102 (i.e., amplifier 102 amplifies all frequency components of input signal 104 substantially equally). As shown, output signal 106 also has a frequency-dependent power spectrum, which is substantially proportional to that of input signal 102. However, as a result of amplification through amplifier 102 (and inherent noise and distortion within amplifier 102), the weaker power components of output signal 106 will have poorer signal-to-noise ratio (SNR) and signal-to-distortion ratio (SDR) than prior to amplification. This degradation in SNR and SDR will further continue in subsequent signal processing stages of the overall system (e.g., mixers, filters, etc.).

Figure 2:
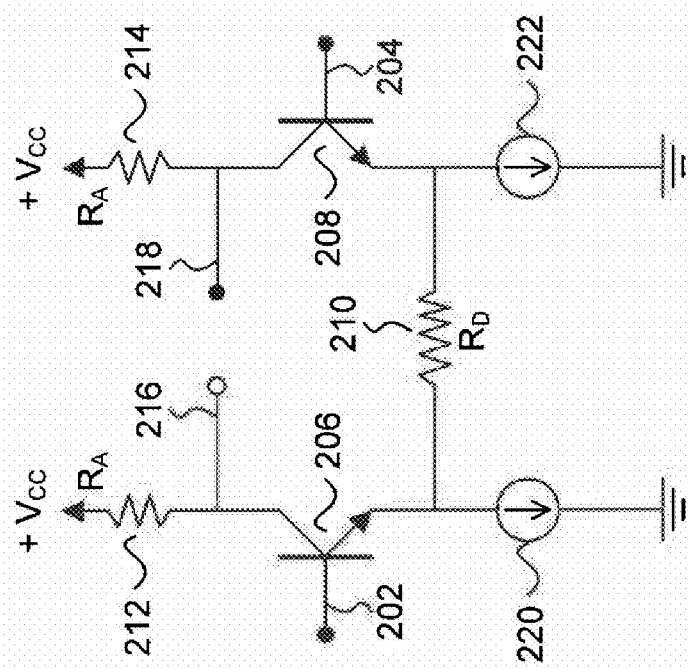
FIG. 2 illustrates an example implementation of a flat gain amplifier.

FIG. 2 illustrates an example implementation of a flat gain amplifier 200. Example amplifier 200 is a differential amplifier having a differential input at nodes 202 and 204 and a differential output formed at nodes 216 and 218. Example amplifier 200 is implemented as a long-tailed pair (LTP) having two bipolar junction transistors (BJTs) 206 and 208 connected together at their emitters via a degeneration resistor 210. The emitters of BJTs 206 and 208 are respectively coupled to ground through constant current sources 220 and 222. The collectors of BJTs 206 and 208 form the differential output of amplifier 200 and are respectively coupled through pull-up resistors 212 and 214 to a positive voltage supply $V_{CC}$.

The gain of example amplifier 200 is approximately equal to $R_A/R_D$, where $R_A$ is the value of pull-up resistors 212 and 214 and $R_D$ is the value of degeneration resistor 210. Since the ratio $R_A/R_D$ is frequency independent, example amplifier 200 has a constant gain over all frequencies.

As described above, however, flat gain amplifiers are not suitable for amplifying frequency-dependent signals, which are typical in many applications. Amplifiers having frequency-dependent gain (i.e., non-constant gain) are therefore needed.

Figure 3:
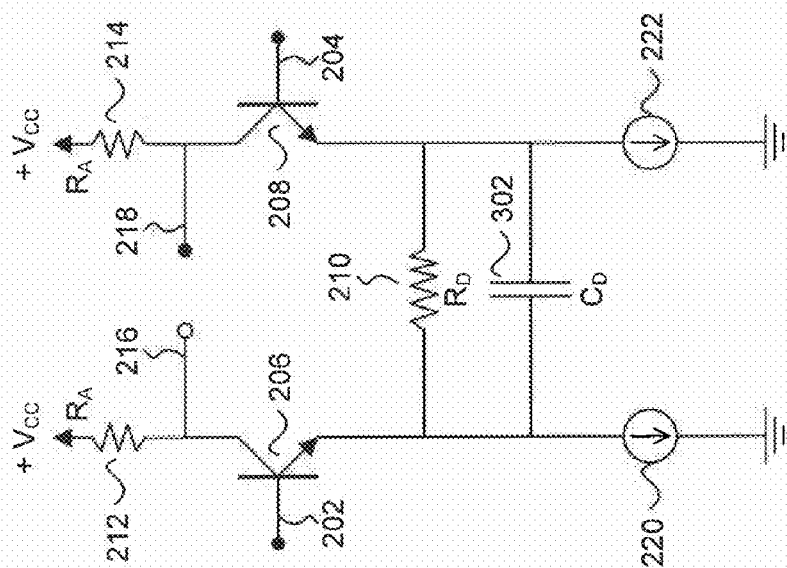
FIG. 3 illustrates an example implementation of a frequency-dependent gain amplifier.

FIG. 3 illustrates an example implementation 300 of a frequency-dependent gain amplifier. As shown in FIG. 3, example amplifier 300 employs a similar implementation as that of example amplifier 200, described above. Further, however, example amplifier 300 uses a degeneration capacitor 302 between the emitters of BJTs 206 and 208. Accordingly, the gain of example amplifier 300 is approximately equal to $$\left| \frac{R_A}{R_D}(1 + j\omega R_D C_D) \right|,$$

where $\omega$ represents the frequency in radians of the input signal and $C_D$ is the value of degeneration capacitor 302.

Note, from the above gain equation of amplifier 300, that at low frequencies, the gain of amplifier 300 approaches the constant gain value $(R_A/R_D)$ of amplifier 200, but slopes up according to the time constant $R_D C_D$. As such, example amplifier 300 is a high-frequency gain boost amplifier, which provides higher amplification for higher frequency components than lower frequency components of the input signal.

Despite having frequency-dependent gain, however, example amplifier 300 has a fixed gain profile. In other words, the gain profile (or frequency response) of example amplifier 300 cannot be adapted according to the input signal, which may vary in terms of frequency composition over time. This may result in sub-optimal amplification using example amplifier 300. On the other hand, improved amplification can be obtained through amplifiers having gain profiles adaptable according to input.

Automatic Amplifier Gain Profile Control

As described above, in many applications, an input signal may not have equal power and density across the entire operating frequency range. Accordingly, when amplified with flat gain across the entire operating frequency range, weaker power components of the signal will have poorer signal-to-noise ratio (SNR) and signal-to-distortion ratio (SDR) than stronger power components. There is a need therefore to amplify the input signal such that the resulting amplified signal has substantially uniform SNR and SDR across the entire operating frequency range. This in turn results in improved dynamic range of the resulting amplified signal.

As noted above, improved amplification of an input signal may be achieved using amplifiers having gain profiles adaptable according to input. For example, based on the input signal, there may be a need to vary, among other parameters, the low-frequency gain, the positive gain roll-up frequency (i.e., frequency at which the low frequency-gain level starts to slope up), the negative gain roll-down frequency (i.e., frequency at which the low-frequency gain level starts to slope down), and/or the gain roll-up/roll-down slope of the amplifier.

Embodiments of the present invention provide systems and methods for automatic amplifier gain profile control. Embodiments of the present invention enable, among other functionalities, variable gain amplification, automatic tilt compensation, and gain boost optimization. Embodiments enable methods for automatically configuring a variable gain amplifier according to received input to optimize the dynamic range of the resulting amplified signal. Embodiments further enable a variable gain profile amplification system. Embodiments of the present invention can be used to enable analog and/or digital amplifiers, including power amplifiers for audio, video, audio/video (AN) (e.g. Cable Television (CATV) and Direct Broadcast Satellite (DBS) signals), and/or broadband RF signals.

Figure 4:
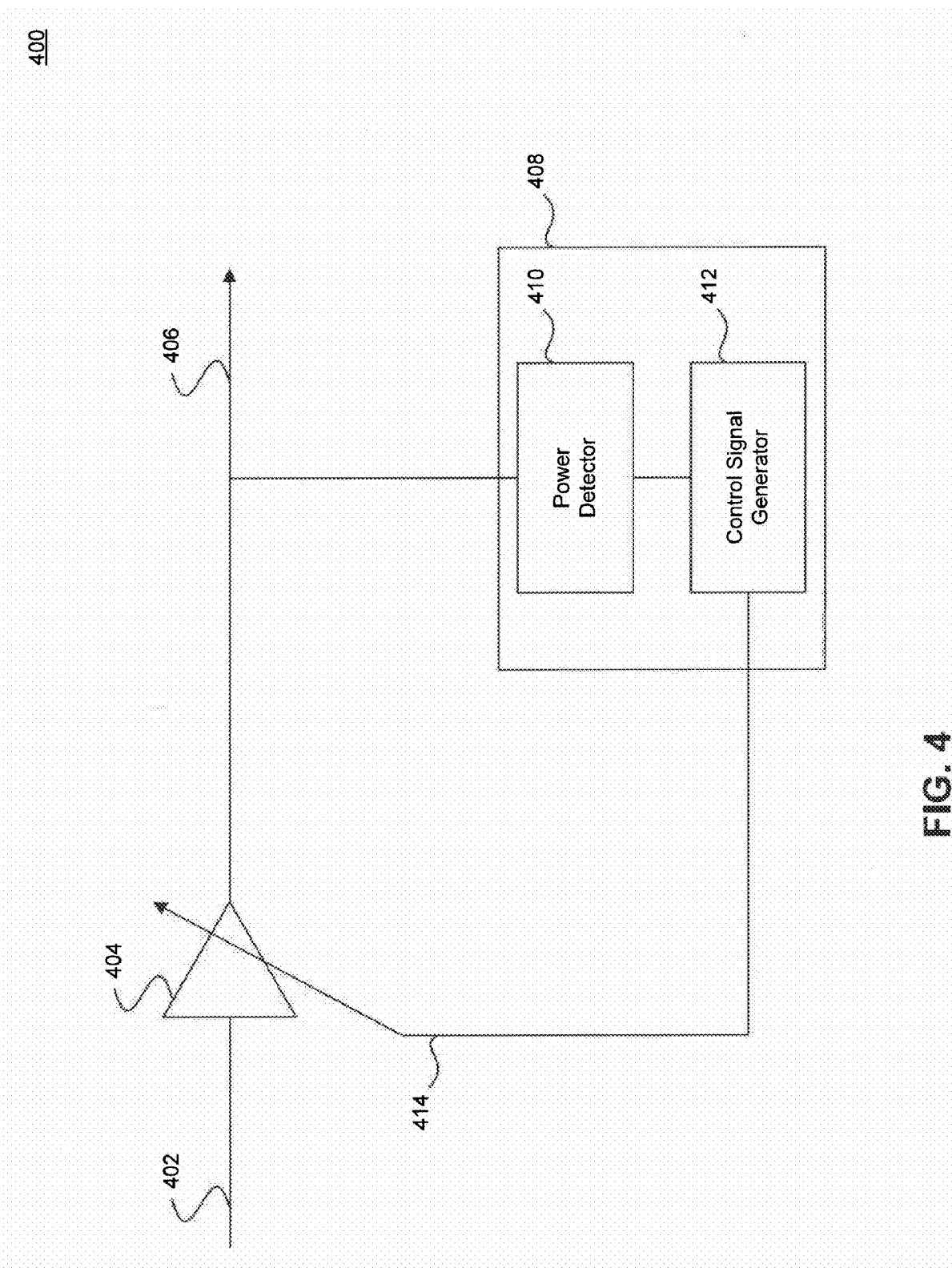
FIG. 4 illustrates an example amplification system having a variable gain profile according to an embodiment of the present invention.

FIG. 4 illustrates an example amplification system 400 having a variable gain profile according to an embodiment of the present invention. As shown, amplification system 400 includes an amplifier 404 and a gain profile controller 408.

Amplifier 404 is a programmable gain profile amplifier. In other words, amplifier 404 can be controlled to vary its gain profile (or in other words, frequency response profile). Amplifier 404 can be, among others, an analog and/or digital amplifier, including, for example, a power amplifier for audio, video, audio/video (A/V) (e.g. Cable Television (CATV) and Direct Broadcast Satellite (DBS) signals), and/or broadband RF signals. Further details and example implementations of amplifier 404 according to embodiments of the present invention are described below with reference to FIGS. 7 and 11-13. As shown in FIG. 4, amplifier 404 receives an input signal 402 and outputs an amplified output signal 406.

Gain profile controller 408 includes a power detector 410 and a control signal generator 412. This example implementation of gain profile controller 408 is provided for the purpose of illustration only and is not limiting of embodiments according to the present invention. In other embodiments, for example, gain profile controller 408 may include more or less components. Further, for ease of description, gain profile controller 408 is described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

In an embodiment, gain profile controller 408 is coupled to output signal 406 of amplifier 404 and provides a control signal 414 to amplifier 404, thereby enabling a gain control feedback mechanism within amplification system 400. In an embodiment, power detector 410 of gain profile controller 408 performs power level measurements of output signal 406 of amplifier 404 and provides the power level measurements to control signal generator 412 of gain profile controller 408. Control signal generator 412 includes means for processing the power level measurements, including, for example, means for performing mathematical (e.g., addition, subtraction, compare, etc.) and statistical operations on the power level measurements, and means for generating control signal 414 based on the power level measurements.

In an embodiment, gain profile controller 408 controls amplifier 404 to vary its gain profile (according to one or more pre-determined profiles) while power detector 418 performs the power level measurements of output signal 406, in order to fully characterize the frequency composition of input signal 402. Subsequently, gain profile controller 408 controls amplifier 404 to configure its gain profile according to an optimum gain profile based on input signal 402.

An example illustrating the operation of variable gain profile amplification system 400 to configure amplifier 404 according to input signal 402 will now be described. This example is provided for the purpose of illustration only and is not limiting of embodiments of the present invention. The example assumes that input signal 402 is a CATV signal received over a frequency-dependent transmission medium (e.g., coaxial cable). As such, input signal 402 may include strong power analog signals at low frequencies and weaker power digital signals at high frequencies. Alternatively, input signal 402 may have substantially uniform power over the entire operating frequency range. Note, however, that this information regarding the frequency composition of input signal 402 is not known a priori by amplification system 400. Rather, the frequency composition of input signal 402 and the optimum gain profile for amplifying input signal 402 are automatically determined at real-time when input signal 402 is received.

Initially, when input signal 402 is received, gain profile controller 408 controls amplifier 404 to select a first gain profile. In an embodiment, the first gain profile is a flat gain profile, in which amplifier 404 amplifies substantially equally all frequency components of input signal 402. With amplifier 404 configured according to the first gain profile, power detector 410 performs a first output power level measurement.

Subsequently, gain profile controller 408 controls amplifier 404 to select a second gain profile. In an embodiment, the second gain profile is a high-frequency gain boost profile, in which amplifier 404 amplifies high-frequency components of input signal 402 at higher gain than low-frequency components of input signal 402. In an embodiment, the first and second gain profiles have substantially equal gain at low-frequency components of input signal 402, and the second gain profile has larger gain than the first gain profile at high-frequency components of input signal 402. With amplifier 404 configured according to the second grain profile, power detector 410 performs a second output power level measurement.

Power detector 410 provides the first and second output power level measurements to control signal generator 412. In an embodiment, control signal generator 412 generates a difference between the first and second output power level measurements, compares the generated difference to a pre-determined threshold, and outputs control signal 414.

In an embodiment, control signal generator 412 outputs, as signal 414, a first control signal to select the first gain profile when the difference is greater than the pre-determined threshold and a second control signal to select the second gain profile when the difference is lower than the pre-determined threshold. In other words, a flat gain profile is selected when the difference between the first and second output power level measurements is greater than the pre-determined threshold. This is because when the first and second gain profiles have substantially equal gain at the low-frequency components of input signal 402, the difference will be substantial only when the high-frequency components have relatively equal power to the low-frequency components of input signal 402 (i.e., no high-frequency gain boost is needed). On the other hand, a high-frequency gain boost profile is selected when the difference between the first and second output power level measurements is lower than the pre-determined threshold. This is because when the first and second gain profiles have substantially equal gain at the low-frequency components of input signal 402, the difference will be negligible when the high-frequency components have substantially lower power than the low-frequency components of input signal 402.

Alternative methods for selecting between the first and second gain profiles can also be used as would be understood by a person skilled in the art based on the teachings herein. For example, in an embodiment, gain profile controller 408 selects the first gain profile when the second output power level measurement is substantially greater than the first output power level measurement. Alternatively, gain profile controller 408 selects the second gain profile when the second output power level measurement is substantially equal to the first output power level measurement or when the second output power level measurement is negligibly greater than the first output power level measurement.

As would be understood by a person skilled in the art based on the teachings herein, the first and second output power level measurements may each include a series of power level measurements or may be the aggregate, average, or other mathematical/statistical outcome of a series of power level measurements.

Figure 5:
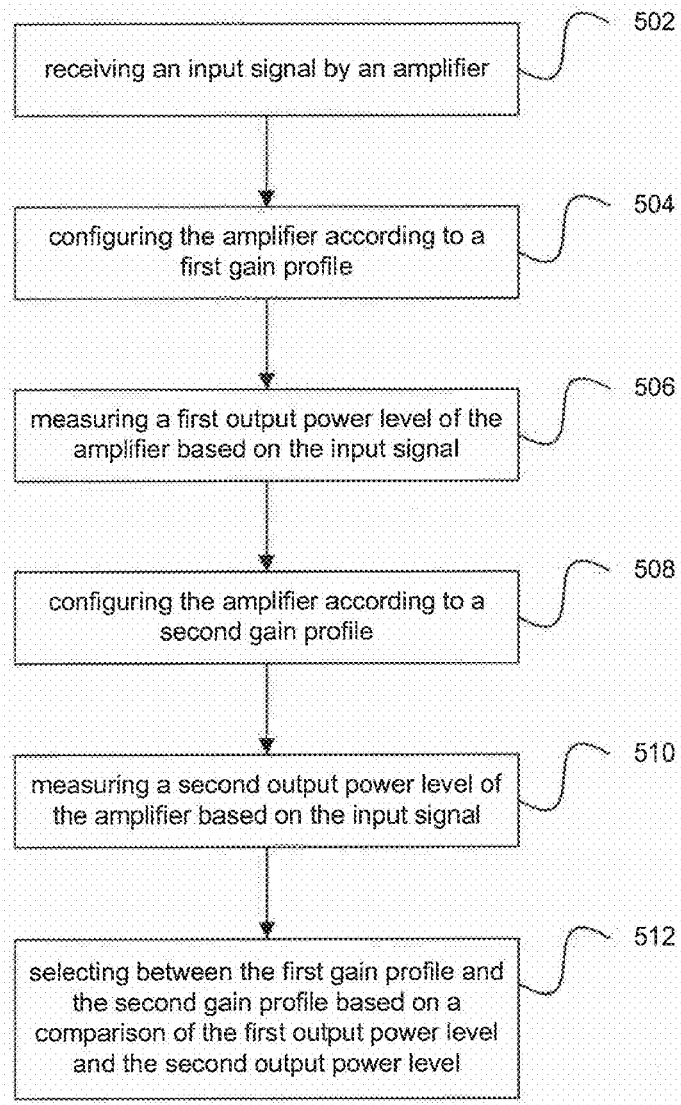
FIG. 5 is a process flowchart of a method for automatic amplifier gain profile configuration.

FIG. 5 is a process flowchart 500 of a method for automatic amplifier gain profile configuration. Process 500 begins in step 502, which includes receiving an input signal by an amplifier.

Step 504 includes configuring the amplifier according to a first gain profile. In an embodiment, step 504 includes configuring the amplifier according to a flat gain profile and amplifying substantially equally all frequency components of the input signal. Subsequently, step 506 includes measuring a first output power level of the amplifier based on the input signal.

Process 500 then proceeds to step 508, which includes configuring the amplifier according to a second gain profile. In an embodiment, the first and second gain profiles have substantially equal gain at low-frequency components of the input signal, and the second gain profile has larger gain than the first gain profile at high-frequency components of the input signal. This is to counter expected In an embodiment, step 508 includes configuring the amplifier according to a high-frequency gain boost profile and amplifying high-frequency components of the input signal at higher gain than low-frequency components of the input signal.

Subsequently, step 510 includes measuring a second output power level of the amplifier based on the input signal.

Process 500 terminates in step 512, which includes selecting between the first gain profile and the second gain profile based on a comparison of the first output power level and the second output power level. In an embodiment, step 512 includes calculating a difference between the first output power level and the second output power level; comparing the difference to a pre-determined threshold; and selecting the first gain profile when the difference is greater than the pre-determined threshold; and selecting the second gain profile when the difference is lower than the pre-determined threshold. In another embodiment, step 512 includes selecting the first gain profile when the second output power level is substantially greater than the first output power level. In a further embodiment, step 512 includes selecting the second gain profile when the second output power level is substantially equal to the first output power level and/or when the second output power is negligibly greater than the first output power level. Other variations for selecting between the first and second gain profiles are also possible as would be understood by a person skilled in the art based on the teachings herein. These variations are within the scope of embodiments of the present invention.

Example amplifier implementations which may be used to implement automatic gain profile configuration as described above, will now be presented.

Figure 6:
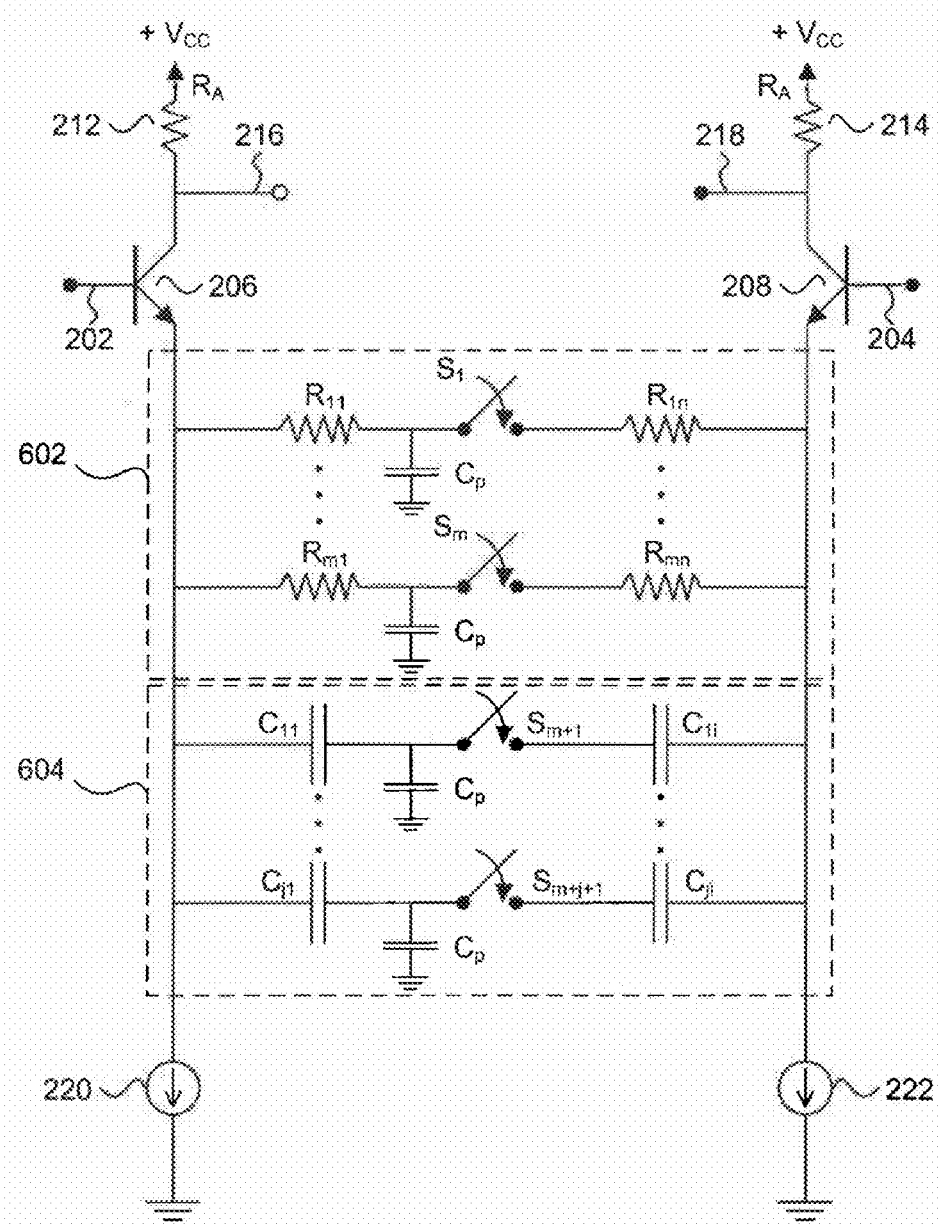
FIG. 6 illustrates an example implementation of a programmable gain amplifier.

FIG. 6 illustrates an example implementation of a programmable gain amplifier 600. Example amplifier 600 can be used, for example, within amplification system 400 as amplifier 404. Example amplifier 600 is provided herein for the purpose of illustration only.

As shown in FIG. 6, example amplifier 600 is a differential amplifier having a differential input at terminal nodes 202 and 204 and a differential output at terminal nodes 216 and 218. Example amplifier 600 further implements a long-tailed pair (LTP) having two bipolar junction transistors (BJTs) 206 and 208 connected together at their emitters via parallel resistive degeneration circuit 602 and capacitive degeneration circuit 604. The emitters of BJTs 206 and 208 are respectively coupled to ground through constant current sources 220 and 222. The collectors of BJTs 206 and 208 form the differential output of amplifier 600 and are respectively coupled through pull-up resistors 212 and 214 to a positive voltage supply $V_{CC}$.

Resistive degeneration circuit 602 includes a plurality of parallel resistive branches, as shown in FIG. 6. Each resistive branch (e.g., branch $R_{11}$ through $R_{1n}$) includes a plurality of resistors coupled in series through one or more controllable switches (for ease of illustration, a single switch is shown per branch). In FIG. 6, example amplifier 600 includes m resistive branches within circuit 602, each having n series coupled resistors. Similarly, capacitive degeneration circuit 604 includes a plurality of parallel capacitive branches. Each capacitive branch (e.g., capacitive branch $C_{11}$ through $C_{1i}$) includes a plurality of capacitors coupled in series through one or more controllable switches (for ease of illustration, a single switch is shown per branch). In FIG. 6, example amplifier 600 includes j capacitive branches within circuit 604, each having i series coupled capacitors.

Example amplifier 600 is a programmable gain profile amplifier. In other words, by switching on/off appropriate ones of the controllable switches (e.g., $S_1$ through $S_{m+j+1}$) in circuits 602 and 604, the gain profile of example amplifier 600 can be controlled. For example, the low-frequency gain of amplifier 600 can be controlled by controlling the effective resistance of circuit 602. For instance, switching on one or more of switches $S_1$ through $S_m$ will increase the effective resistance of circuit 602 and, correspondingly, the low-frequency gain of amplifier 600. Similarly, the positive gain roll-up frequency and slope can be controlled by controlling the time constant of resistive and capacitive circuits 602 and 604. Other parameters of the gain profile of amplifier 600 can also be controlled as would be understood by a person skilled in the art based on the teachings herein.

However, as example implementation 600 relies on controllable switches for gain profile variability, unwanted parasitic capacitance associated with these switches will be present. This is illustrated in FIG. 6 by capacitors $C_p$ associated with each controllable switch $S_1$ to $S_{m+j+1}$. As a result, it is difficult to accurately determine and control the effective capacitance of degeneration circuits 602 and 604 in amplifier 600, and subsequently to accurately control the gain profile of amplifier 600.

Figure 7:
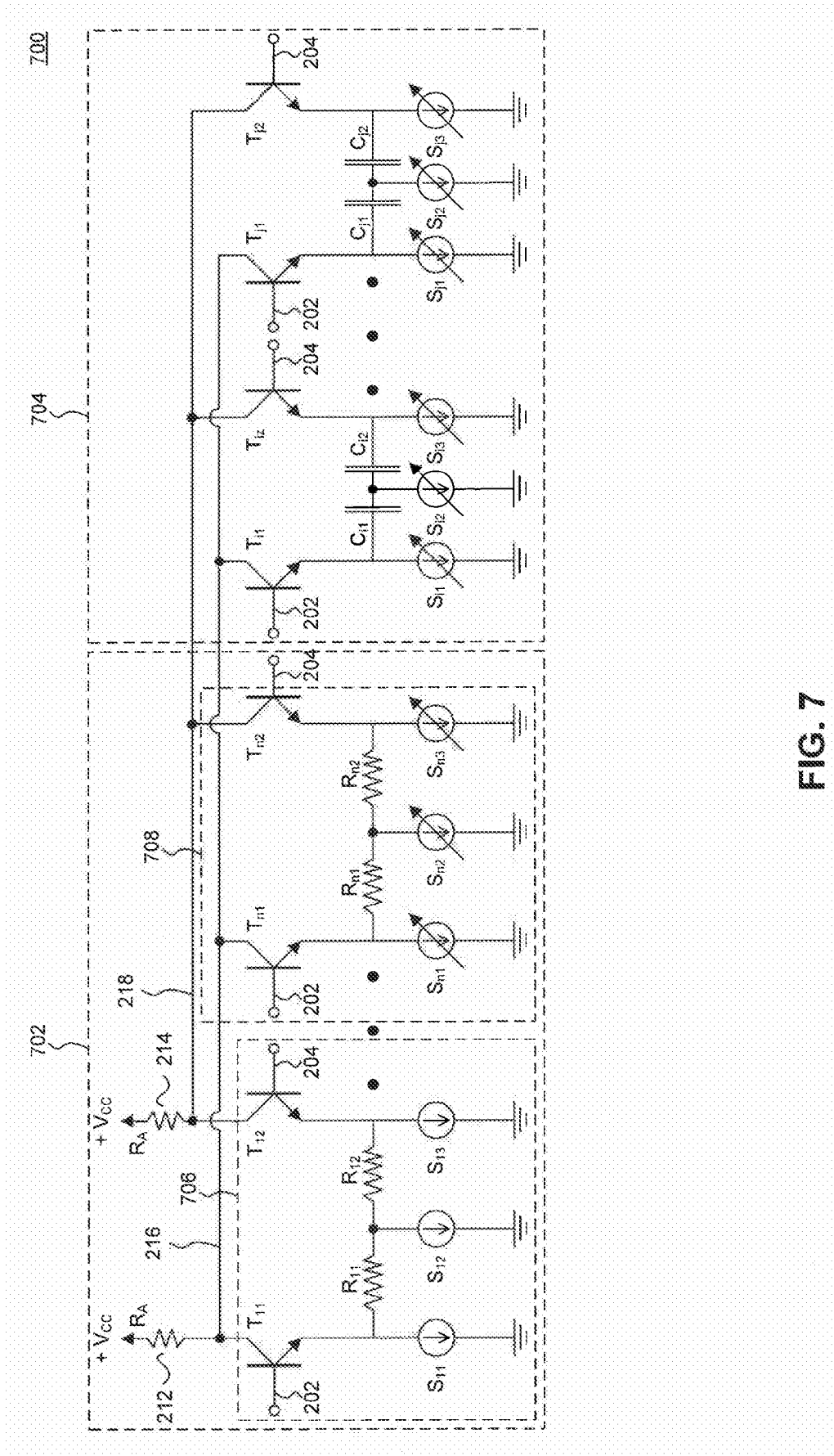
FIG. 7 illustrates an example implementation of a programmable gain amplifier according to an embodiment of the present invention.

FIG. 7 illustrates an example implementation of a programmable gain amplifier 700 according to an embodiment of the present invention. Example amplifier 700 can be used, for example, within amplification system 400 as amplifier 404. Example amplifier 700 is not limiting of the scope of embodiments of the present invention.

As shown in FIG. 7, example amplifier 700 employs a differential implementation and includes a differential input at terminal nodes 202 and 204 and a differential output at terminal nodes 216 and 218. In other embodiments, example amplifier 700 may use a single-ended implementation.

Example amplifier 700 further includes a plurality of parallel collector-coupled differential amplification stages. The common collector nodes of the plurality of amplification stages are connected to a voltage source $V_{CC}$ through pull-up resistors 212 and 214. Each differential amplification stage is implemented as a long-tailed pair (LTP) having two bipolar junction transistors (BJTs) connected together at their emitters via a resistive or capacitive degeneration circuit. The emitters of the BJTs are coupled to ground or a negative supply through current sources.

In an embodiment, the plurality of parallel amplification stages include a first plurality of parallel amplification stages 702 having resistive degeneration circuits (e.g., differential pairs $T_{11}, T_{12}$ through $T_{n1}, T_{n2}$) and a second plurality of parallel amplification stages 704 having capacitive degeneration circuits (e.g., differential pairs $T_{j1}, T_{j2}$ through $T_{j1}, T_{j2}$). One or more stages of the first and/or the second plurality of amplification stages use constant current sources (e.g., amplification stage 706 uses constant current sources $S_{11}, S_{12}, S_{13}$) to couple the emitters of their respective BJTs to ground or a negative supply, and one or more stages of the first and/or the second plurality of amplification stages use controlled current sources (e.g., amplification stage 708 uses controlled current sources $S_{n1}, S_{n2}, S_{n3}$) to couple the emitters of their respective BJTs to ground or a negative supply.

Accordingly, one or more stages of the first and/or second plurality of amplification stages (having constant current sources) can be used to coarsely approach a nominal gain profile of amplifier 700, and one or more stages of the first and/or second plurality of amplification stages (having controlled current sources) can be used to fine tune the actual gain profile of amplifier 700 to achieve the nominal gain profile.

In an embodiment, the low-frequency gain level of amplifier 700 can be controlled by switching on/off controlled current sources in amplification stages 702 having resistive degeneration circuits, thereby affecting the overall degeneration resistance of amplifier 700. For example, assuming in example amplifier 700 that only amplification stage 706 (i.e., differential amplifier $T_{11}, T_{12}$) uses constant current sources, that in all intermediate amplification stages between amplification stage 706 and amplification stage 708 all current sources are turned off, and that in amplification stage 708 only current source $S_{n2}$ is turned on, then the overall degeneration resistance of amplifier 700 would be approximately the parallel equivalent of $(R_{11}+R_{12})$ and $(R_{n1}+R_{n2})$.

Similarly, the positive gain roll-up frequency and slope (or the negative gain roll-off frequency and slope) can be controlled by switching on/off controlled current sources in amplification stages 704 having capacitive degeneration circuits.

It is noted that example amplifier 700 employs no switches. As such, the parasitic capacitance effect present in example amplifier 600 is eliminated in example amplifier 700. The gain profile of example amplifier 700 is determined and controlled only by the values of its discrete resistor/capacitor components. This significantly increases the gain profile control accuracy of example amplifier 700.

As noted above, example amplifier 700 is provided for the purpose of illustration and not limitation. Other equivalent implementations and/or variations of example amplifier 700 are possible as would be understood by a person skilled in the art based on the teachings herein. Equivalent implementations and/or variations may include, for example, variations in transistor type (e.g., PNP, MOSFET, JFET, CMOS, etc.), variations in amplifier configuration (e.g., common-collector, common-base, common-source, common-drain, common-gate, Darlington pair, Cascode, Sziklai pair, etc.), and variations in amplifier input/output configuration (e.g., single-ended, single-input-single-output, single-input-multiple-output, etc.).

Automatic Component Calibration for Increased Gain Profile Accuracy

As described above, there is a need to accurately set and control the gain profile of an amplifier for best amplification performance. Additionally, this may be required in some applications, in which it is desirable to accurately determine the gain profiles of signal processing blocks for management and optimization of the overall system (e.g., Data over Cable Service Interface Specifications (DOCSYS) standard applications).

Embodiments of the present invention described above provide systems and methods for accurate amplifier gain profile control, including an example implementation in which parasitic capacitance is eliminated for increased accuracy. Nonetheless, gain profile inaccuracies may still result from temperature and/or process variations inherently present in integrated circuit (IC) implementations.

Embodiments of the present invention provide systems and methods for increased gain profile accuracy. Particularly, embodiments of the present invention provide systems and methods to reduce the effects of temperature and/or process variations on the gain profile of an amplifier through automatic calibration (including automatic trimming) of components of the amplifier. Embodiments of the present invention can be used in analog and/or digital amplifers, including power amplifiers for audio, video, audio/video (A/V, (e.g. Cable Television (CATV) and Direct Broadcast Satellite (DBS) signals), and/or broadband RF signals.

Figure 8:
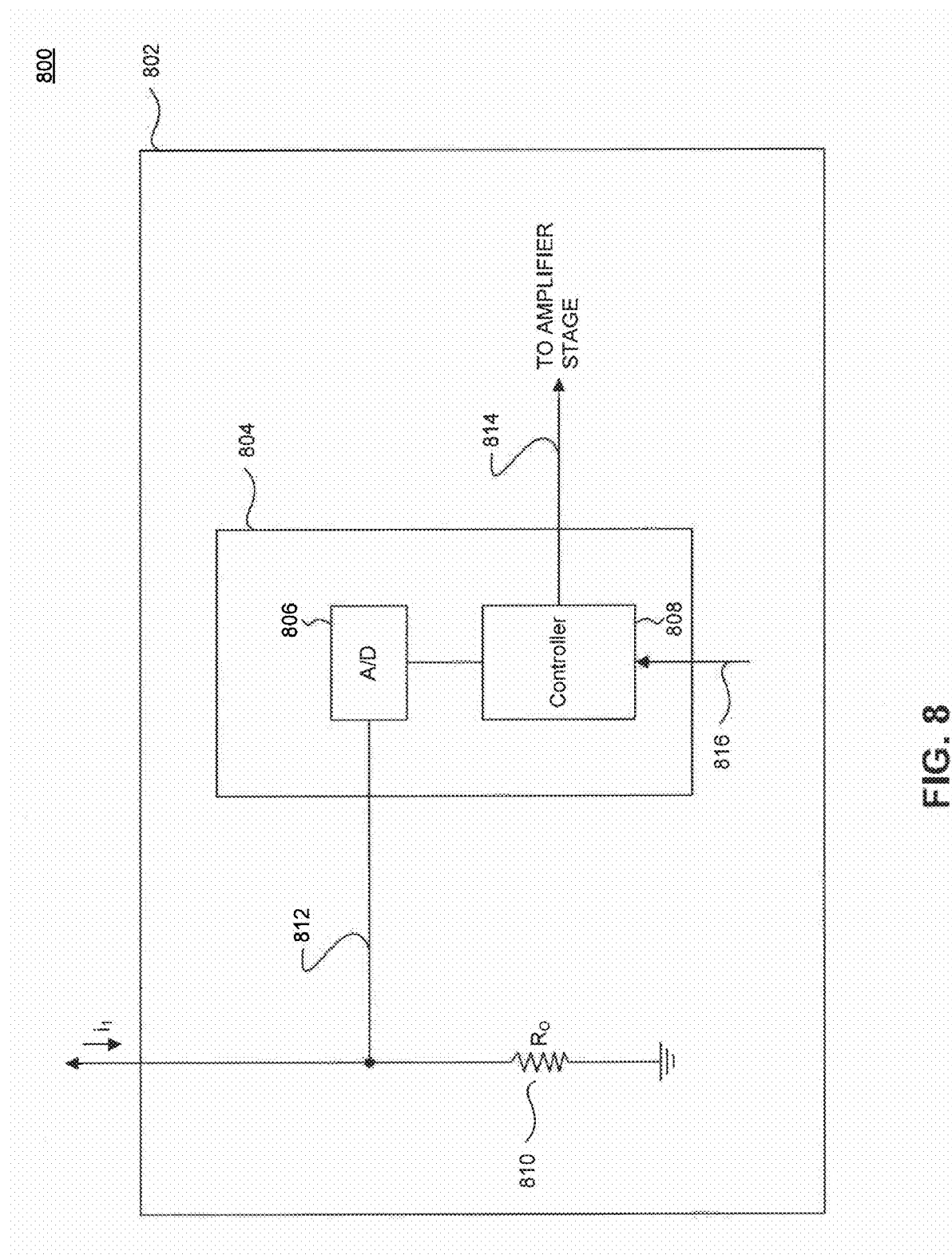
FIG. 8 is an example that illustrates a system for automatic component calibration according to an embodiment of the present invention.

FIG. 8 is an example 800 that illustrates a system 802 for automatic component calibration according to an embodiment of the present invention. System 802 can be used to automatically calibrate components within an integrated circuit in order to compensate for temperature and/or process variations, for example. In example 800, system 802 is used with an amplifier integrated circuit, which results in increased gain profile accuracy of the amplifier integrated circuit and reduces the effects of temperature and/or process variations on the gain profile of the amplifier integrated circuit. For example, system 802 can be used with example amplifier 700. System 802, however, is not limited to usage in accordance with example 800 and may be used within any other integrated circuit, as would be understood by a person skilled in the art based on the teachings herein.

As shown in example 800, system 802 includes a resistor 810 and a logic circuit 804.

Resistor 810 is an on-chip calibration resistor (i.e., located on the integrated circuit that system 802 is intended to calibrate). For example, resistor 810 may be located on an amplifier integrated circuit such as example amplifier 700, for example.

Logic circuit 804 includes an analog-to-digital converter (ADC) 806 and a controller 808. Logic circuit 804 may be located on-chip or off-chip. In other embodiments, components of logic circuit 804 (e.g., ADC 806 and controller 808) may be located within different circuits, either on-chip or off-chip.

According to an embodiment of the present invention, a current of pre-determined value is generated through on-chip calibration resistor 810, which causes a voltage 812 to form across calibration resistor 810. ADC 806 measures and converts from analog-to-digital voltage 812 and outputs the measured voltage to controller 808. Controller 808 receives the measured voltage from ADC 806, compares the measured voltage to a reference voltage 816, and generates a control signal 814 based on the comparison of the measured voltage and reference voltage 816, to calibrate on-chip circuit resistors of the amplifier integrated circuit that system 802 is intended to calibrate. In an embodiment, the on-chip circuit resistors include degeneration resistors, thereby control signal 814 calibrating a gain profile of the amplifier integrated circuit.

In an embodiment, reference voltage 816 is generated across an off-chip precision resistor (not shown in FIG. 8) having a resistance value independent of process and/or temperature variations and equal (or proportional) to a nominal resistance value of on-chip calibration resistor 810. Accordingly, when the measured voltage across on-chip calibration resistor 810 is different than (or not proportional to) reference voltage 816, the actual resistance value of on-chip calibration resistor 810 is different than the nominal resistance value of on-chip calibration resistor 810. This indicates a drift in the actual resistance value of resistor 810 due to temperature and/or process variations, for example, within the amplifier integrated circuit.

In an embodiment, on-chip calibration resistor 810 is of the same type as the on-chip circuit resistors and is therefore affected similarly as the on-chip circuit resistors by temperature and/or process variations within the amplifier integrated circuit. Accordingly, when a drift from nominal exists in the actual resistance value of calibration resistor 810, a similar drift exists in the actual resistance values of the on-chip circuit resistors of the amplifier integrated circuit, and appropriate calibration is needed for increased accuracy in the gain profile of the amplifier integrated circuit.

Several variations for generating control signal 814 exist according to embodiments of the present invention. For example, in an embodiment, logic circuit 804 generates control signal 814 when the measured voltage is different than the reference voltage. In another embodiment, logic circuit 804 generates control signal 814 when a difference between the measured voltage and the reference voltage is greater than a threshold value. In an embodiment, control signal 814 calibrates the on-chip circuit resistors according to a difference between the measured voltage and the reference voltage.

Calibration using system 802 can be performed at start-up and/or periodically during operation of the amplifier integrated circuit. In an embodiment, logic circuit 804 generates control signal 814 at start-up of the amplifier integrated circuit to calibrate the on-chip circuit resistors due to process variations within the amplifier integrated circuit. In another embodiment, logic circuit 804 periodically generates control signal 814 during operation of the amplifier integrated circuit to calibrate the on-chip circuit resistors due to temperature variations within the amplifier integrated circuit.

Figure 10:
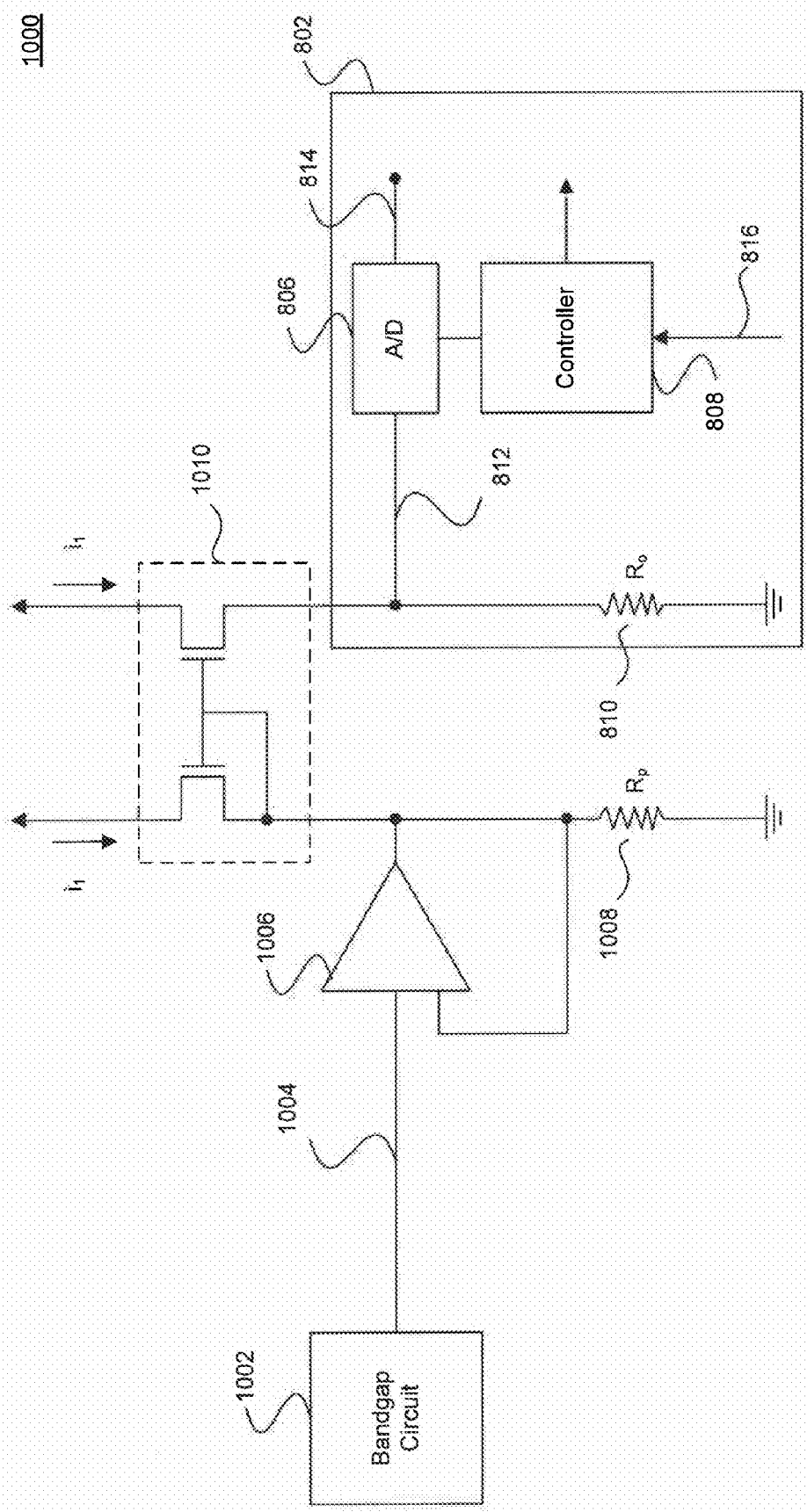
FIG. 10 is an example implementation of an automatic component calibration system according to an embodiment of the present invention.

FIG. 10 is an example implementation 1000 of an automatic component calibration system according to an embodiment of the present invention. As shown, example implementation 1000 includes system 802, as described above in FIG. 8, a bandgap circuit 1002, an operational amplifier 1006, a current mirror circuit 1010, and a precision resistor 1008.

Bandgap circuit 1002 is a voltage reference circuit, which generates a bandgap voltage 1004. For example, bandgap voltage 1004 may be approximately equal to 1.25 Volts, which is the theoretical bandgap of Silicon at 0° K. In an embodiment, bandgap voltage 1004 is equal to the reference voltage used by system 802.

Operational amplifier 1006 is configured as a voltage follower amplifier (buffer amplifier). As such, amplifier 1006 receives voltage 1004 at its non-inverting input node and generates a voltage equal to voltage 1004 at its output node.

The output node of amplifier 1006 is coupled to a first end of precision resistor 1008. A second end of precision resistor 1008 is coupled to ground. As such, a current $i_1$ having a value equal to bandgap voltage 1004 divided by the resistance value of precision resistor 1008 flows through precision resistor 1008. In an embodiment, precision resistor 1008 is located off-chip (i.e., not located within the integrated circuit that system 802 is used to calibrate). Accordingly, the resistance value of precision resistor 1008 is temperature and/or process independent. Similarly, the value of current $i_1$ is temperature and/or process independent.

Current mirror circuit 1010 generates an identical copy of current which flows in its input branch, in its output branch. The output branch of current mirror circuit 1010, as shown in FIG. 10, provides the bias current that flows through on-chip calibration resistor 810, as described above in FIG. 8.

According to example implementation 1000, when the actual resistance value of on-chip calibration resistor 810 is equal to the resistance value of precision resistor 1008 (or equivalently the nominal resistance value of resistor 810), the measured voltage across resistor 810 will be equal to bandgap voltage 1004 or the reference voltage. On the other hand, when a drift exists in the actual resistance value of on-chip calibration resistor 810 relative to its nominal resistance value (e.g., due to temperature and/or process variations), the measured voltage across resistor 810 will be different than bandgap voltage 1004, and appropriate calibration of components of the amplifier integrated circuit is needed.

Figure 9:
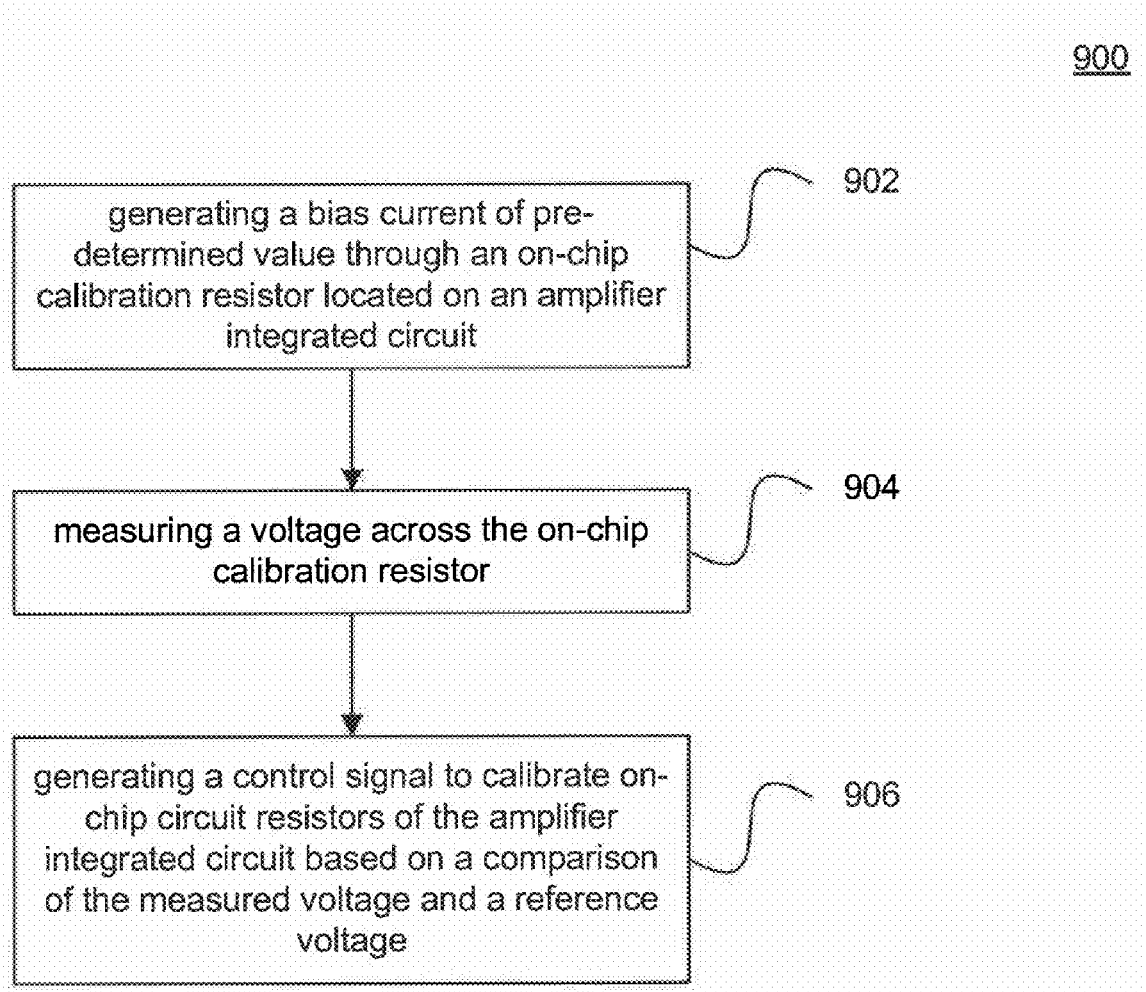
FIG. 9 is a process flowchart of a method for automatic component calibration according to an embodiment of the present invention.

FIG. 9 is a process flowchart 900 of a method for automatic component calibration according to an embodiment of the present invention. Process 900 can be used to automatically calibrate components within an integrated circuit, in order to compensate for temperature and/or process variations, for example. When used within an amplifier integrated circuit, increased gain profile accuracy and a reduction in the effects of temperature and/or process variations on the gain profile of the amplifier can be achieved. Process 900, however, is not limited to usage within an amplifier integrated circuit, as described below, and may be used within any other integrated circuit, as would be understood by a person skilled in the art based on the teachings herein.

Process 900 begins in step 902, which includes generating a bias current of pre-determined value through an on-chip calibration resistor located on an amplifier integrated circuit. In an embodiment, the on-chip calibration resistor has a nominal resistance value equal to a resistance value of an off-chip precision resistor. In an embodiment, the on-chip calibration resistor is of the same type as on-chip circuit resistors, thereby the on-chip calibration resistor and the on-chip circuit resistors are similarly affected by temperature and/or process variations within the amplifier integrated circuit.

Step 904 includes measuring a voltage across the on-chip calibration resistor. In an embodiment, step 904 further includes converting the measured voltage from analog-to-digital.

Subsequently, step 906 includes generating a control signal to calibrate on-chip circuit resistors of the amplifier integrated circuit based on a comparison of the measured voltage and a reference voltage. In an embodiment, the on-chip circuit resistors include degeneration resistors, thereby the control signal calibrating a gain profile of the amplifier integrated circuit.

In an embodiment, step 906 further includes generating the control signal when the measured voltage is different than the reference voltage. In another embodiment, step 906 further includes generating the control signal when a difference between the measured voltage and the reference voltage is greater than a threshold value. In a further embodiment, step 904 further includes calibrating the on-chip circuit resistors according to a difference between the measured voltage and the reference voltage when the measured voltage is different than the reference voltage.

According to an embodiment of the present invention, steps 902-906 of process 900 are performed at start-up of the amplifier integrated circuit to calibrate the on-chip circuit resistors due to process variations within the amplifier integrated circuit. Alternatively or additionally, steps 902-906 of process 900 are performed periodically during operation of the amplifier integrated circuit to calibrate the on-chip circuit resistors due to temperature variations within the amplifier integrated circuit.

Example Implementations

Example implementations according to the present invention, which may be used to implement automatic amplifier gain profile control and/or automatic component calibration as described above, will now be presented. These example embodiments are provided for the purpose of illustration and are not limiting of the scope of embodiments of the present invention.

Figure 11:
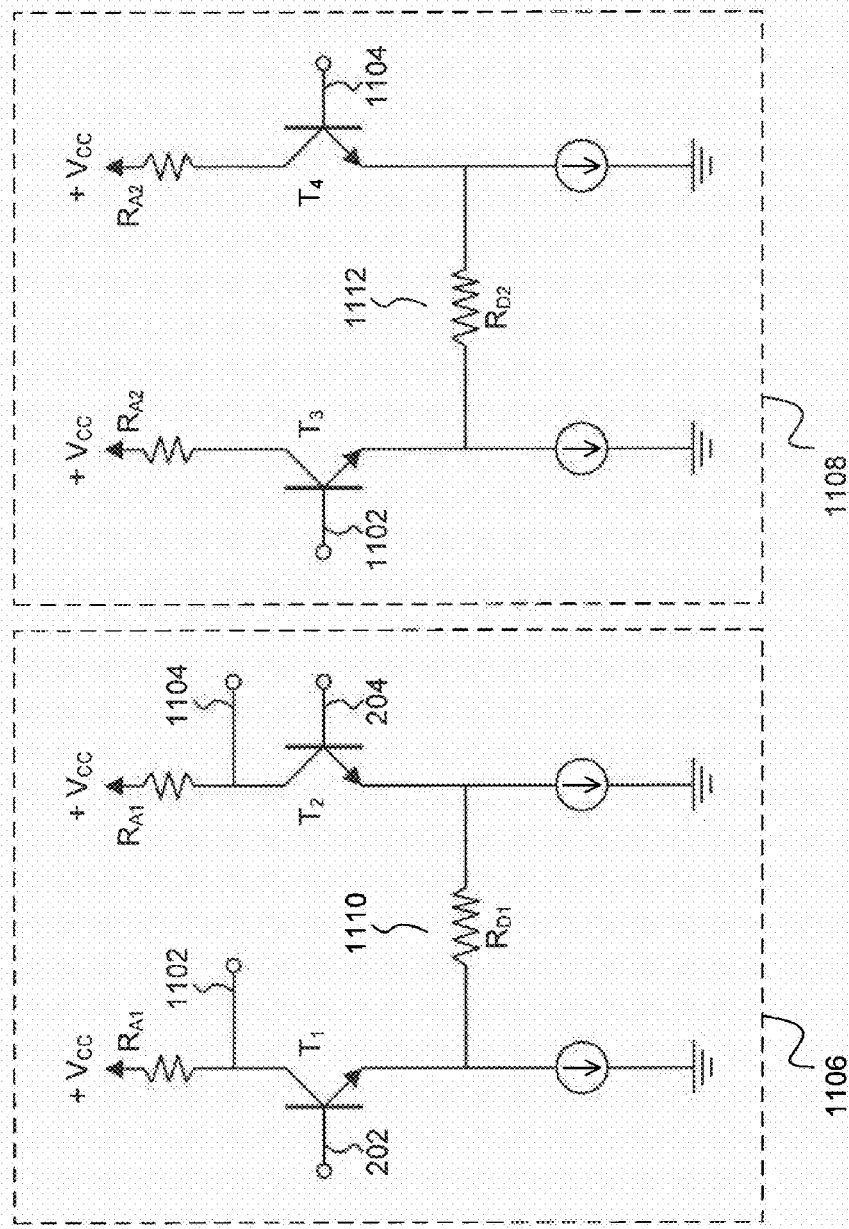
FIG. 11 illustrates an example two-stage differential amplifier according to an embodiment of the present invention.

FIG. 11 illustrates an example two-stage differential amplifier 1100 according to an embodiment of the present invention. As shown, example amplifier 1100 includes a first amplifier stage 1106 and a second amplifier stage 1108. In an embodiment, first amplifier stage 1106 is a variable gain stage amplifier, and second amplifier stage 1108 is a fixed gain stage amplifier. Both stages, as shown in FIG. 11, are differential amplifiers, with the differential output (1102, 1104) of amplifier stage 1106 providing the differential input of amplifier stage 1108.

Figure 12:
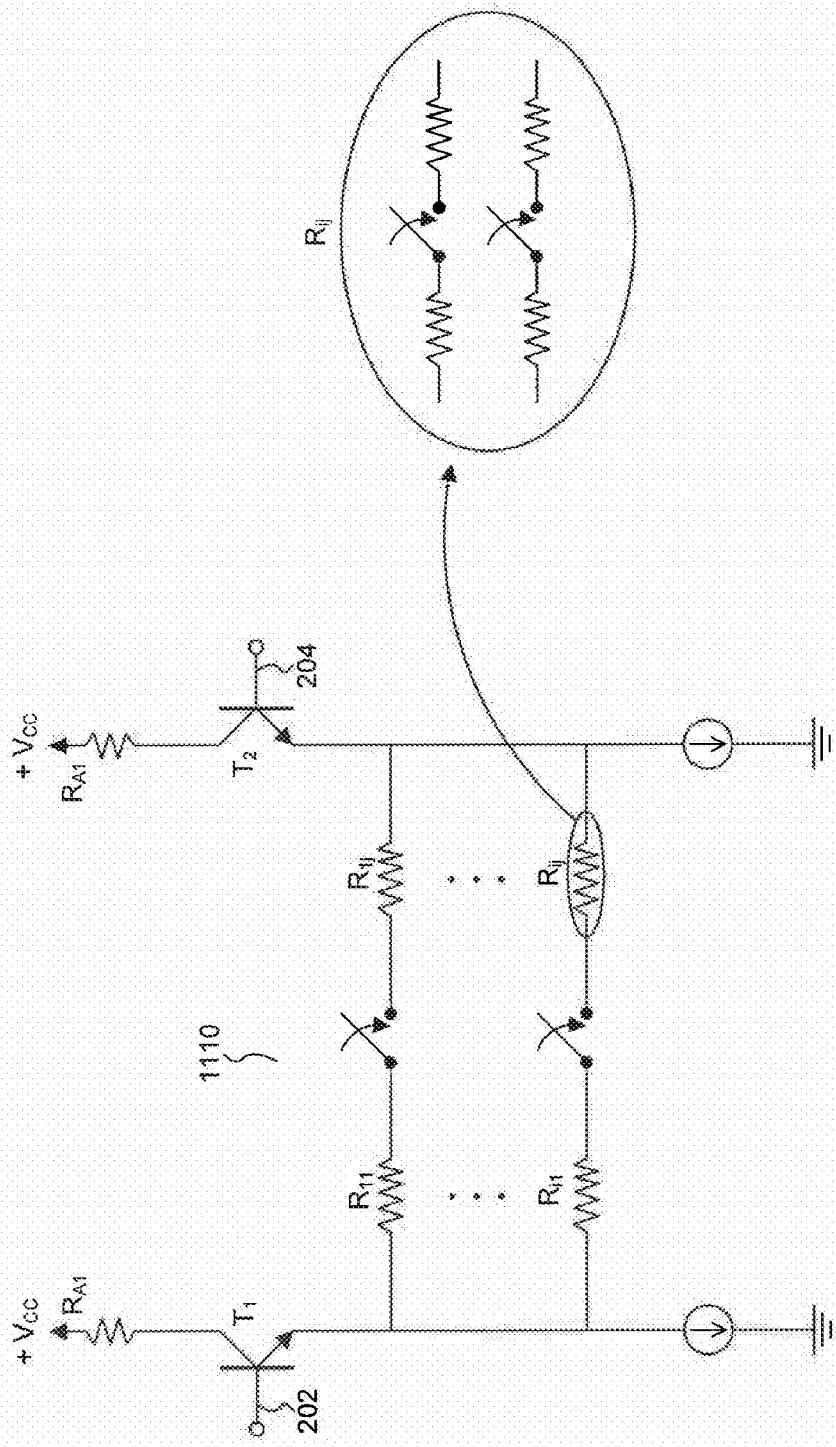
FIG. 12 illustrates an example implementation of a variable gain amplifier stage according to an embodiment of the present invention.

FIG. 12 illustrates an example implementation 1200 of a variable gain amplifier stage according to an embodiment of the present invention. Example implementation 1200 may be an implementation of amplifier stage 1106 of example amplifier 1100. As shown, example implementation 1200 implements a long-tailed pair (LTP) having two bipolar junction transistors (BJTs) $T_1$ and $T_2$ connected together at their emitters via a plurality of parallel degeneration resistive branches, which are equivalent to degeneration resistor $R_{D1}$ 1110 in amplifier stage 1106. Each resistive branch (e.g., branch $R_{11}$ through $R_{1j}$) includes a plurality of resistors coupled in series through one or more controllable switches (for ease of illustration, a single switch is shown per branch). Further, each resistor within a resistive branch is implemented as a plurality of controllable resistive branches as shown, for example, with respect to resistor $R_{ij}$ in FIG. 12. This provides for high controllability of the value of each resistor, resulting in increased gain profile control accuracy and precise calibration/tuning.

Figure 13:
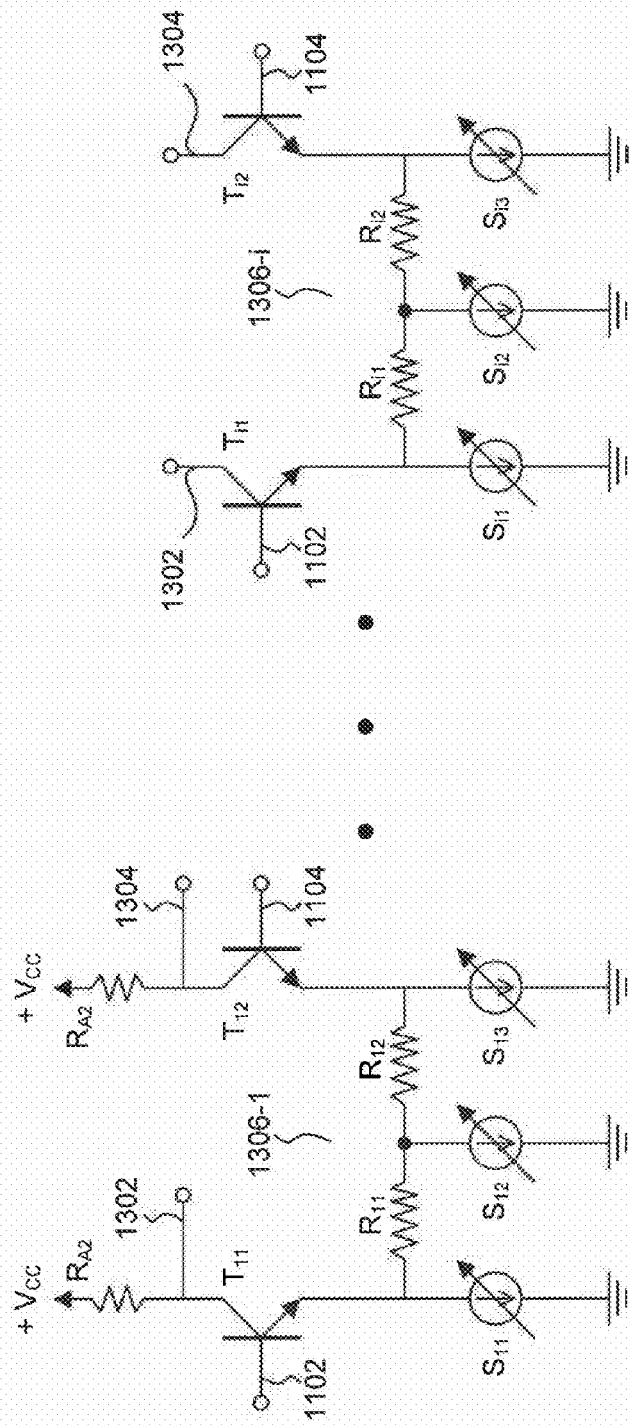
FIG. 13 illustrates an example implementation of a fixed gain amplifier stage according to an embodiment of the present invention.

FIG. 13 illustrates an example implementation 1300 of a fixed gain amplifier stage according to an embodiment of the present invention. Example implementation 1300 may be an implementation of amplifier stage 1108 of example amplifier 1100. As shown, example implementation 1300 includes a plurality of parallel collector-coupled differential amplification stages. Each differential amplification stage is implemented as a long-tailed pair (LTP) having two bipolar junction transistors (BJTs) connected together at their emitters via a resistive degeneration circuit 1306. Degeneration circuits 1306-1 through 1306-$i$ are equivalent to degeneration resistor $R_{D2}$ 1112 in amplifier stage 1108. The emitters of the BJTs are coupled to ground through controlled current sources.

In an embodiment, the effective degeneration resistance within each differential amplification stage of example implementation 1300 can be varied by switching on/off appropriate ones of the controlled current sources. This allows for both amplifier gain profile control and/or component calibration, as described above. In another embodiment, the first amplification stage of example implementation 1300 (i.e., $T_{11}$, $T_{12}$) has a non-variable effective degeneration resistance equal to a nominal degeneration resistance of the overall amplifier stage. Subsequent amplification stages have variable effective degeneration resistances which can be controlled to calibrate the effective degeneration resistance of the overall amplifier stage, in order to approach the nominal degeneration resistance.

It is noted that implementing amplifier stage 1108 according to example implementation 1300 provides a low noise figure (NF), as switches with parasitic capacitance can be avoided. This is significant since amplifier stage 1108 is the last stage of example amplifier 1100 and is typically coupled to further signal processing components within a system chain.

According to embodiments of the present invention, automatic gain profile control and/or automatic component calibration, as described above, can be implemented in example amplifier stages 1200 and 1300 by switching appropriate ones of the controllable switches (in amplifier stage 1220) or current sources (in amplifier stage 1300). Switching of the controllable switches/current sources can be done using control signals generated by the gain profile controller (described above in FIG. 4) and/or the automatic calibration system (described above in FIG. 8).

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for automatic component calibration, comprising:
   (a) generating a bias current of pre-determined value through an on-chip calibration resistor located on an integrated circuit;
   (b) measuring a voltage across said on-chip calibration resistor;
   (c) comparing said measured voltage and a reference voltage;
   (d) generating a control signal to calibrate on-chip circuit resistors of said integrated circuit based on the comparison of said measured voltage and said reference voltage, and
   (e) switching appropriate ones of a plurality of controlled current sources to calibrate said on-chip circuit resistors.

2. The method of claim 1, wherein step (d) comprises:
   generating said control signal when said measured voltage is different than said reference voltage.

3. The method of claim 1, wherein step (d) comprises:
   generating said control signal when a difference between said measured voltage and said reference voltage is greater than a threshold value.

4. The method of claim 1, further comprising:
   (f) calibrating said on-chip circuit resistors according to a difference between said measured voltage and said reference voltage when said measured voltage is different than said reference voltage.

5. The method of claim 1, wherein said on-chip circuit resistors include degeneration resistors, thereby said control signal calibrating a gain profile of said integrated circuit.

6. The method of claim 1, wherein said controlled current sources comprise MOSFET-switches.

7. The method of claim 1, wherein steps (a)-(c) are performed at start-up of said integrated circuit to calibrate said on-chip circuit resistors due to process variations within said integrated circuit.

8. The method of claim 1, wherein steps (a)-(d) are performed periodically during operation of said integrated circuit to calibrate said on-chip circuit resistors due to temperature variations within said integrated circuit.

9. The method of claim 1, wherein said on-chip calibration resistor has a nominal resistance value equal to a resistance value of an off-chip precision resistor.

10. A method for automatic component calibration, comprising:
    (a) generating a bias current of pre-determined value through an on-chip calibration resistor located on an integrated circuit;
    (b) measuring a voltage across said on-chip calibration resistor;
    (c) comparing said measured voltage and a reference voltage; and
    (d) generating a control signal to calibrate on-chip circuit resistors of said integrated circuit based on the comparison of said measured voltage and said reference voltage;
    wherein said on-chip calibration resistor has a nominal resistance value equal to a resistance value of an off-chip precision resistor, and wherein said reference voltage is substantially equal to the product of said pre-determined value of said bias current and said resistance value of said off-chip precision resistor.

11. The method of claim 10, wherein said reference voltage is a bandgap reference voltage, wherein said resistance value of said off-chip precision resistor is temperature and process independent, thereby said pre-determined value of said bias current is temperature and process independent.

12. The method of claim 9, wherein an actual resistance value of said on-chip calibration resistor is different than said nominal resistance value of said on-chip calibration resistor when said measured voltage is different than said reference voltage.

13. The method of claim 1, wherein said on-chip calibration resistor is of the same type as said on-chip circuit resistors, thereby said on-chip calibration resistor and said on-chip circuit resistors are similarly affected by temperature and process variations.

14. A method for automatic component calibration, comprising:,
    (a) generating bias current of re-determined value through an on-chip calibration resistor located on an integrated circuit;
    (b) measuring a voltage across said on-chip calibration resistor;
    (c) comparing said measured voltage and a reference voltage; and
    (d) generating a control signal to calibrate on-chip circuit resistors of said integrated circuit based on the comparison of said measured voltage and said reference voltage:,
    wherein said reference voltage is a bandgap reference voltage.

15. The method of claim 1, wherein said integrated circuit is a broadband RF amplifier.

16. A system for automatic component calibration, comprising:
    an on-chip calibration resistor located on an integrated circuit;
    a first circuit that generates a bias current of pre-determined value through said on-chip calibration resistor;
    an analog-to-digital converter that measures a voltage across said on-chip calibration resistor and converts said measured voltage from analog to digital; and
    a logic circuit that receives said measured voltage, compares said measured voltage to a reference voltage, and generates a control signal to calibrate on-chip circuit resistors of said integrated circuit based on the comparison of said measured voltage and said reference voltage.

17. The system of claim 16, wherein said logic circuit generates said control signal when said measured voltage is different than said reference voltage.

18. The system of claim 16, wherein said logic circuit generates said control signal when a difference between said measured voltage and said reference voltage is greater than a threshold value.

19. The system of claim 16, wherein said control signal calibrates said on-chip circuit resistors of said integrated circuit according to a difference between said measured voltage and said reference voltage.

20. The system of claim 16, wherein said on-chip circuit resistors include degeneration resistors, thereby said control signal calibrating a gain profile of said integrated circuit.

21. The system of claim 16, further comprising:
a plurality of controlled current sources that switch appropriately to calibrate said on-chip circuit resistors.

22. The system of claim 21, wherein said controlled current sources comprise MOSFET switches.

23. The system of claim 16, wherein said logic circuit generates said control signal at start-up of said integrated circuit to calibrate said on-chip circuit resistors due to process variations within said integrated circuit.

24. The system of claim 16, wherein said logic circuit periodically generates said control signal during operation of said integrated circuit to calibrate said on-chip circuit resistors due to temperature variations within said integrated circuit.

25. The system of claim 16, wherein said on-chip calibration resistor has a nominal resistance value equal to a resistance value of an off-chip precision resistor.

26. The system of claim 25, wherein an actual resistance value of said on-chip calibration resistor is different than said nominal resistance value of said on-chip calibration resistor when said measured voltage is different than said reference voltage.

27. The system of claim 25, wherein said first circuit comprises:
a bandgap circuit that generates a bandgap voltage equal to said reference voltage; and
a current mirror circuit that generates said bias current, wherein said pre-determined value of said bias current is equal to said bandgap voltage divided by said resistance value of said off-chip precision resistor.

28. The system of claim 27, wherein said resistance value of said off-chip resistor is temperature and process independent, thereby said pre-determined value of said bias current is temperature and process independent.

29. The system of claim 16, wherein said on-chip calibration resistor is of the same type as said on-chip circuit resistors, thereby said on-chip calibration resistor and said on-chip circuit resistors are similarly affected by temperature and process variations.

30. The system of claim 16, wherein said logic circuit comprises a logic controller.

31. The system of claim 16, wherein said integrated circuit is a broadband RF amplifier.

* * * * *

UNITED STATES PATENT AND TRADEMARK OFFICE
CERTIFICATE OF CORRECTION

| | | |
|---|---|---|
| PATENT NO. | : 8,022,755 B2 | |
| APPLICATION NO. | : 12/856290 | |
| DATED | : September 20, 2011 | |
| INVENTOR(S) | : Gomez et al. | |

It is certified that error appears in the above-identified patent and that said Letters Patent is hereby corrected as shown below:

Column 15, line 49, "MOSFET-switches" should be replaced with --MOSFET switches--.

Column 16, line 31, "generating bias current" should be replaced with --generating a bias current--.

Column 16, line 31, "re-determined" should be replaced with --pre-determined--.

Signed and Sealed this
Twenty-second Day of November, 2011

David J. Kappos
*Director of the United States Patent and Trademark Office*